US008900980B2

(12) United States Patent
Wang et al.

(10) Patent No.: US 8,900,980 B2
(45) Date of Patent: Dec. 2, 2014

(54) DEFECT-FREE SIGE SOURCE/DRAIN FORMATION BY EPITAXY-FREE PROCESS

(75) Inventors: Chih-Hao Wang, Hsin-Chu (TW); Shih-Hsieng Huang, Renwu Township (TW); Ta-Wei Wang, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 1663 days.

(21) Appl. No.: 11/361,249

(22) Filed: Feb. 24, 2006

(65) Prior Publication Data
US 2007/0173022 A1 Jul. 26, 2007

Related U.S. Application Data

(60) Provisional application No. 60/760,480, filed on Jan. 20, 2006.

(51) Int. Cl.
H01L 21/00 (2006.01)
H01L 29/78 (2006.01)
H01L 21/265 (2006.01)
H01L 29/66 (2006.01)

(52) U.S. Cl.
CPC ......... H01L 29/7833 (2013.01); H01L 29/6656 (2013.01); H01L 29/6659 (2013.01); H01L 29/7848 (2013.01); H01L 21/26506 (2013.01)
USPC ..... 438/505; 438/506; 438/510; 257/E21.135

(58) Field of Classification Search
USPC .......................... 438/505, 506, 510, 514, 527; 257/E21.135, E21.127
See application file for complete search history.

(56) References Cited

U.S. PATENT DOCUMENTS

| 4,728,619 | A |   | 3/1988  | Pfiester et al. |         |
|-----------|---|---|---------|-----------------|---------|
| 5,683,934 | A |   | 11/1997 | Candelaria      |         |
| 5,698,869 | A |   | 12/1997 | Yoshimi et al.  |         |
| 5,714,777 | A |   | 2/1998  | Ismail et al.   |         |
| 5,885,861 | A | * | 3/1999  | Gardner et al.  | 438/231 |
| 6,051,458 | A |   | 4/2000  | Liang et al.    |         |
| 6,190,975 | B1|   | 2/2001  | Kubo et al.     |         |

(Continued)

FOREIGN PATENT DOCUMENTS

CN 1123470 A 5/1996

OTHER PUBLICATIONS

Chidambaram, P.R., et al., "35% Drive Current Improvement from Recessed-SiGe Drain Extensions on 37nm Gate Length PMOS," IEEE, 2004 Symposium on VLSI Technology Digest of Technical Papers, pp. 48-49.

(Continued)

Primary Examiner — Julia Slutsker
(74) Attorney, Agent, or Firm — Slater & Matsil, L.L.P.

(57) ABSTRACT

MOSFET transistors having localized stressors for improving carrier mobility are provided. Embodiments of the invention comprise a gate electrode formed over a substrate, a carrier channel region in the substrate under the gate electrode, and source/drain regions on either side of the carrier channel region. The source/drain regions include an embedded stressor having a lattice constant different from the substrate. In a preferred embodiment, the substrate is silicon and the embedded stressor is SiGe. Implanting a portion of the source/drain regions with Ge forms the embedded stressor. Implanting carbon into the source/drain regions and annealing the substrate after implanting the carbon suppresses dislocation formation, thereby improving device performance.

16 Claims, 2 Drawing Sheets

(56) References Cited

U.S. PATENT DOCUMENTS

| | | |
|---|---|---|
| 6,258,695 B1 | 7/2001 | Dunn et al. |
| 6,303,450 B1 | 10/2001 | Park et al. |
| 6,355,962 B1 | 3/2002 | Liang et al. |
| 6,380,044 B1 * | 4/2002 | Talwar et al. .................. 438/308 |
| 6,406,973 B1 | 6/2002 | Lee |
| 6,437,375 B1 | 8/2002 | Beaman |
| 6,492,216 B1 | 12/2002 | Yeo et al. |
| 6,649,538 B1 | 11/2003 | Cheng et al. |
| 6,689,671 B1 | 2/2004 | Yu et al. |
| 6,696,729 B2 | 2/2004 | Adachi |
| 6,746,909 B2 | 6/2004 | Nishiyama |
| 6,806,151 B2 | 10/2004 | Wasshuber et al. |
| 6,809,016 B1 | 10/2004 | Xiang |
| 6,921,913 B2 | 7/2005 | Yeo et al. |
| 6,953,972 B2 | 10/2005 | Yeo et al. |
| 7,320,907 B2 * | 1/2008 | Hsieh et al. .................. 438/166 |
| 7,432,146 B2 * | 10/2008 | Yamamoto .................. 438/197 |
| 2001/0048119 A1 | 12/2001 | Mizuno et al. |
| 2002/0008289 A1 | 1/2002 | Murota et al. |
| 2002/0011617 A1 | 1/2002 | Kubo et al. |
| 2002/0011628 A1 | 1/2002 | Takagi |
| 2002/0068393 A1 | 6/2002 | Fitzgerald et al. |
| 2002/0123183 A1 | 9/2002 | Fitzgerald |
| 2002/0190284 A1 | 12/2002 | Murthy et al. |
| 2003/0057416 A1 | 3/2003 | Currie et al. |
| 2004/0026765 A1 | 2/2004 | Currie et al. |
| 2004/0038468 A1 | 2/2004 | Hwang et al. |
| 2004/0087075 A1 | 5/2004 | Wang et al. |
| 2004/0107908 A1 | 6/2004 | Collins et al. |
| 2004/0173815 A1 * | 9/2004 | Yeo et al. .................. 257/192 |
| 2004/0175872 A1 | 9/2004 | Yeo et al. |
| 2005/0014353 A1 | 1/2005 | Mansoori et al. |
| 2005/0017305 A1 | 1/2005 | Koyama et al. |
| 2005/0029560 A1 | 2/2005 | Wasshuber et al. |
| 2005/0035409 A1 | 2/2005 | Ko et al. |
| 2005/0079692 A1 | 4/2005 | Samoilov et al. |
| 2005/0112857 A1 | 5/2005 | Gluschenkov et al. |
| 2005/0139872 A1 | 6/2005 | Chidambaram et al. |
| 2005/0139930 A1 | 6/2005 | Chidambarrao et al. |
| 2005/0148134 A1 * | 7/2005 | Dokumaci et al. ............ 438/199 |
| 2005/0170594 A1 | 8/2005 | Yeo et al. |
| 2005/0181621 A1 | 8/2005 | Borland et al. |
| 2005/0189589 A1 | 9/2005 | Zhu et al. |
| 2005/0205858 A1 * | 9/2005 | Li .................. 257/19 |
| 2005/0218455 A1 | 10/2005 | Maeda et al. |
| 2005/0224786 A1 | 10/2005 | Lin et al. |
| 2006/0006427 A1 * | 1/2006 | Tan et al. .................. 257/227 |
| 2006/0115969 A1 | 6/2006 | Hsieh et al. |
| 2006/0163651 A1 | 7/2006 | Rotondaro et al. |
| 2006/0234455 A1 * | 10/2006 | Chen et al. .................. 438/276 |
| 2007/0096149 A1 * | 5/2007 | Liu et al. .................. 257/192 |

OTHER PUBLICATIONS

Ghani, T., et al., "A 90nm High Volume Manufacturing Logic Technology Featuring Novel 45nm Gate Length Strained Silicon CMOS Transistors," IEDM, 2003 IEEE, pp. 978-980.

Öztürk, M. C., et al., "Advanced $Si_{1-x}Ge_x$ Source/Drain and Contact Technologies for Sub-70 nm CMOS," IEDM, 2002 IEEE, pp. 375-378.

Mistry, K., et al., "Delaying Forever: Uniaxial Strained Silicon Transistors in a 90nm CMOS Technology," IEEE, 2004 Symposium on VLSI Technology Digest of Technical Papers, pp. 50-51.

Nishiyama, A., et al, "SiGe Source/Drain Structure for the Suppression of the Short-Channel Effect of Sub-0.1-μm p-Channel MOSFETs," 2001 IEEE, IEEE Transactions on Electron Devices, vol. 48, No. 6, Jun. 2001, pp. 1114-1120.

Zhang, D., et al., "Embedded SiGe S/D PMOS on Thin Body SOI Substrate with Drive Current Enhancement," 2005 Symposium on VLSI Technology Digest of Technical Papers, pp. 26-27.

Ohta, H., et al., "High Performance 30 nm Gate Bulk CMOS for 45 nm Node with Σ-shaped SiGe-SD," IEDM, 2005, IEEE, 4 pages.

Shimizu, A., et al., "Local Mechanical-Stress Control (LMC): A New Technique for CMOS-Performance Enhancement," IEDM, 2001, IEEE, pp. 433-436.

Borland, J., et al., "USJ and strained-Si formation using infusion doping and deposition," Solid State Technology: The International Magazine for Semiconductor Manufacturing, http://www.solid-state.com/articles, May 2004, 4 pages.

* cited by examiner

DEFECT-FREE SIGE SOURCE/DRAIN FORMATION BY EPITAXY-FREE PROCESS

This application claims the benefit of U.S. Provisional Application No. 60/760,480, filed on Jan. 20, 2006, entitled Defect-Free SiGe Source/Drain Formation by Epitaxy-Free Process, which application is hereby incorporated herein by reference.

TECHNICAL FIELD

This invention relates generally to semiconductor devices, and more particularly to methods and structures for forming strained channel transistors.

BACKGROUND

The continued size reduction of metal-oxide-semiconductor field-effect transistors (MOSFET) has improved the speed, density, and cost per unit function of integrated circuits. One way to MOSFET performance is through selective application of stress to the transistor channel region. Stress distorts or strains the semiconductor crystal lattice, which affects the band alignment and charge transport properties of the semiconductor. By controlling the magnitude and distribution of stress in a finished device, manufacturers can increase carrier mobility and improve device performance. There are several existing approaches of introducing stress in the transistor channel region.

In one conventional approach, a strained-channel transistor is fabricated on an epitaxial Si layer that is grown on a relaxed SiGe layer. Because the lattice constant of SiGe is larger than Si, the epitaxial Si layer is under a biaxial tensile strain. A transistor made on the epitaxial strained-Si layer will have a channel region under the biaxial tensile strain. In this approach, relaxed SiGe layer serves as a stressor that introduces strain in the channel region. In another approach, a high-stress film is formed over a completed transistor. The high-stress film distorts the silicon lattice thereby straining the channel region.

In another approach, for example in PMOS fabrication, a method uses substrate structures that apply a compression stress to the channel. One method uses modified shallow trench isolation (STI) structures that compress the PMOS channel. Another method forms an embedded SiGe layer within the source/drain regions for compressing the PMOS channel.

In a conventional process, the embedded SiGe stressor is formed using selective epitaxy growth (SEG), chemical vapor deposition, ultra-high vacuum chemical vapor deposition, or molecular beam epitaxy. These approaches are very expensive because a several micron thick SiGe layer is often used. Also, numerous dislocations exist within the SiGe layer, some of which propagate to strained-Si layer, resulting in high defect density, thereby negatively affecting transistor performance. Other problems include complicated process integration and low throughput.

In light of these problems, workers in the art have developed advanced implantation methods for SiGe stressor formation. One method uses gas cluster ion beam (GCIB) irradiation. J. O. Borland, et al. in U.S. Patent Application Publication No. U.S. 2005/0181621 A1, which publication is hereby incorporated by reference in its entirety, provides the details of an infusion process. Unlike conventional ion implantation, which involves individual ions, the GCIB process implants clusters of atoms. Infusion therefore enables simultaneous implantation of multiple chemical species. Infusion also enables more rapid and economical implantation of concentrated dopants, such as SiGe alloys used in strained transistor engineering.

Despite recent advances in strain engineering, problems remain. Infusion generates end of range (EOR) defects in the substrate. EOR defects enhance migration of dopants and stressors thereby making steep concentration gradients near stressors and abrupt junctions difficult to form. Annealing removes some EOR defects, but requires additional process steps, and it is not completely effective. Accordingly, there still remains a need for improved structures and methods for strain engineered semiconductor device fabrication.

SUMMARY OF THE INVENTION

These and other problems are generally reduced, solved or circumvented, and technical advantages are generally achieved, by embodiments of the present invention, which provide methods and structures for forming strained MOS devices.

An embodiment of the invention provides a semiconductor fabrication method. A method comprises forming a gate electrode over a substrate and forming an embedded stressor in the substrate on either side of the gate electrode. Carbon is added into the embedded stressor, and the substrate is annealed after adding the carbon.

In another embodiments of the invention, a method comprises forming a gate electrode over a substrate and forming source/drain regions in the substrate oppositely adjacent the gate electrode. Preferred embodiments further implanting a portion of the source/drain regions with a Ge. Embodiments preferably further include implanting carbon into the source/drain regions, and annealing the substrate after implanting the carbon.

Still other embodiments of the invention provide a method of suppressing defect formation in strained-channel transistors. A method comprises forming a transistor in a substrate. The transistor may comprise a gate electrode over a silicon substrate, a channel region in the substrate under the gate electrode, and source/drain regions in the substrate oppositely adjacent the source/drain regions. Embodiments further include implanting a first element, X, into the source/drain regions, wherein the first element occupies a silicon crystalline lattice site, and wherein a Si—X chemical bond has a greater interatomic spacing (larger lattice constant) than a Si—Si chemical bond. Embodiments preferably further include implanting a second element, Y, into the source/drain regions, wherein the second element occupies a silicon crystalline lattice site, and wherein an Si—Y chemical bond has a smaller interatomic spacing (smaller lattice constant) than a Si—Si chemical bond. Preferred embodiments preferably further include annealing the substrate after implanting the second element, so that source/drain regions apply a compressive stress to the channel region of the strained-channel transistor.

Embodiments of the invention advantageously avoid high cost and low throughput problems of conventional epitaxial SiGe source/drain engineering. For example, the cost and complexity of selective SiGe epitaxy is avoided. Embodiments also avoid bridge issues in source/drain extension and gate-oxide overlap areas. Silicon recess process concerns with respect to source/drain regions are reduced as well. Embodiments provide defect free source/drain extension regimes with optimal carbon implantation and post annealing.

Throughout the specification and in the claims, the term layer is used. A layer should not be interpreted only as a continuous or uninterrupted feature, however. As will be clear from reading the specification, the layer may be separated into distinct and isolated features (e.g., active regions or device fabrication regions). In other embodiments, a layer may refer to a continuous feature having a uniform appearance; yet, it may include regions having different physical or chemical properties.

It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention. The intermediated stages of manufacturing a preferred embodiment of the present invention are illustrated throughout the various views and illustrative embodiments of the present invention.

This invention relates generally to semiconductor device fabrication and more particularly to structures and methods for strained transistors. This invention will now be described with respect to preferred embodiments in a specific context, namely the creation of a MOSFET device. It is believed that embodiments of this invention are particularly advantageous when used in this process. It is also believed that embodiments described herein will benefit other applications not specifically mentioned.

Figure 1:
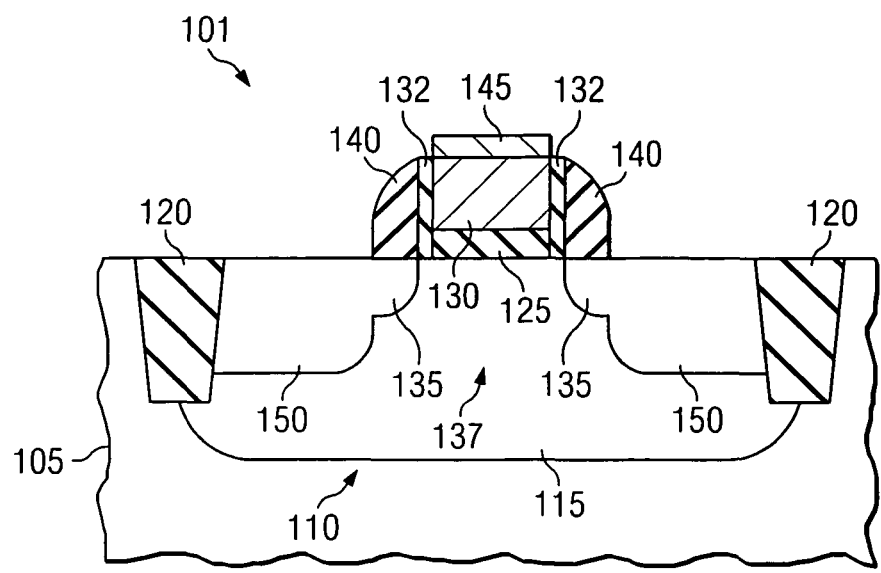
FIG. 1 is cross-sectional view of a partially fabricated, strained-channel MOSFET according to embodiments of the invention.

Shown in FIG. 1 is a schematic cross-sectional diagram of a MOSFET 101 at an early stage in its fabrication in accord with the preferred embodiments of the invention. The intermediate device includes a substrate 105, which may comprise Si, Ge, GaAs, or other materials. The substrate 105 may also comprise silicon on insulator (SOI) technology. The substrate 105 may comprise a p-doped, (100) silicon wafer. The substrate 105 includes an active region 110 suitable for forming different semiconductor devices, preferably a PMOSFET. The active region 110 may include a doped well region 115.

An isolation structure, such as a shallow trench isolation (STI) region 120, may be formed within the substrate 105 to isolate active regions: STI regions 120 are formed using conventional thermal growth methods and isolation region deposition and patterning methods. Formed over the active region 110 is a gate dielectric 125. The gate dielectric 125 may include a thermally grown silicon oxide having a thickness from about 6 Å to about 100 Å, and more preferably less than about 20 Å. The gate dielectric 125 may also comprise high-k dielectrics. Suitable high-k dielectrics may comprise materials such as $HfO_x$, $HfSiO_x$, $HfSiO_xN_y$, $AlO_x$, $LaO_x$, $HfAlO_x$, $ZrO_2$, $Al_2O_3$, $TiO_2$, $Ta_2O_5$, $La_2O_3$, $CeO_2$, $Bi_4Si_2O_{12}$, $WO_3$, $Y_2O_3$, $LaAlO_3$, $Ba_{(1-x)}Sr_xTiO_3$, $PbTiO_3$, $BaTiO_3$, $SrTiO_3$, $PbZrO_3$, PST, PZN, PZT, PMN, or combinations thereof.

A gate electrode 130 is formed over the gate dielectric 125. The gate electrode 130 may comprise metals, metal alloys, metal-containing materials, and polycide (doped polysilicon/metal silicide), for example. It may also comprise chemical vapor deposition (CVD) polysilicon between about 100 Å and about 10,000 Å thick and more preferably between about 500Å and about 2,000 Å. The gate electrode may further include about 1E20 $cm^{-3}$ dopant of polarity opposite the channel region of the corresponding MOS device to be formed therefrom. Such doping advantageously provides for enhanced off current (Ioff) performance, enhanced drain saturation current (Idsat) performance and possibly enhanced short channel effect (SCE) performance of a field effect transistor (FET) device. Preferably, the gate electrode 130 comprises a material such as TiN, TaN, $NiSi_x$, Mo, $MoSi_x$, $TaSi_xN_y$, or combinations thereof. The gate electrode 130 may also comprise materials such as Ta, Ti, Mo, W, Pt, Al, Hf, Ru, and silicides or nitrides thereof.

An electrode liner 132 may be formed over sidewalls of the gate electrode 130. A suitable liner may include a thermal oxide, for example. Using the gate electrode 130 and the liner 132 as a mask, lightly doped source/drain (LDS/LDD) 135 regions may be formed in the substrate 105 using an implant of boron dopant between about $1*10^{13}$ ions/$cm^2$ and about $5*10^{14}$ ions/$cm^2$ or an implant of phosphorus between about $1*10^{13}$ ions/$cm^2$ and about $5*10^{14}$ ions/$cm^2$. Between the LDS/LDD regions 135 there is a channel region 137 that is strained according to embodiments of the invention as described below.

Formed over sidewalls of the gate electrode 130 are sidewall spacers 140. The sidewall spacers 140 serve as self-aligning masks for performing one or more high concentration ion implants within the source/drain regions. The sidewall spacers 140 preferably comprise a dielectric oxide, a nitride, or an oxinitride. Suitable examples include silicon nitride ($Si_3N_4$), or a nitrogen containing layer other than $Si_3N_4$, such as $Si_xN_y$, silicon oxynitride $SiO_xN_y$, silicon oxime $SiO_xN_y$:$H_z$, or a combination thereof. In a preferred embodiment, the sidewall spacers 140 are formed from a layer comprising $Si_3N_4$ that has been formed using chemical vapor deposition (CVD) techniques using silane and ammonia as precursor gases.

The sidewall spacers 140 may be formed using techniques known in the art. A lithography process may be performed to selectively remove unwanted portions of the spacer material. In a preferred embodiment, a portion 145 of the gate electrode material remains over the gate electrode 130 before sidewall spacers 140 are formed to serve as an implant mask in fabrication steps provided below. Forming the sidewall spacers 140 may use an etching process that is either wet or dry, anisotropic or isotropic, but is preferably an anisotropic dry etch process. In an embodiment, the sidewall spacers 140 are from about 1 nm to about 100 nm wide.

Using the gate electrode material 145 and the sidewall spacers 140 as a mask, heavily doped source/drain regions 150 are formed using an implant of boron, $BF_2$, and indium dopant between about $1*10^{14}$ ions/cm$^2$ and about $1*10^{16}$ ions/cm$^2$, thereby producing the MOSFET 101 illustrated in FIG. 1.

Figure 2:
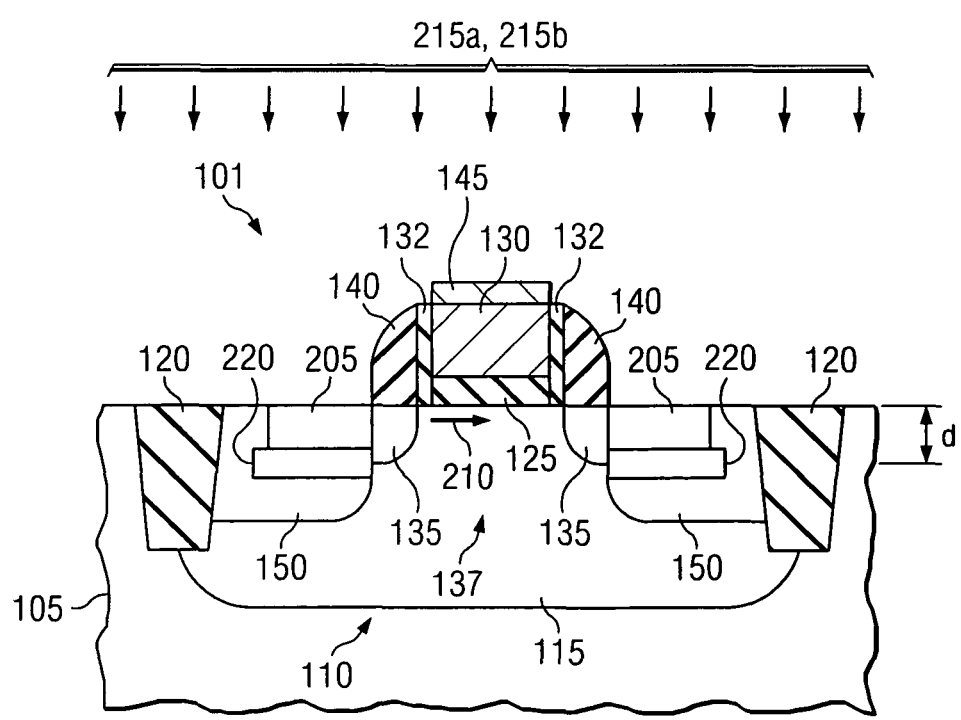
FIG. 2 is cross-sectional view of epi-free source/drain stressor formation according to embodiments of the invention.

Turning now to FIG. 2, there is illustrated the MOSFET 101 of FIG. 1 after further processing according to an embodiment of the invention. An embedded stressor 205 is formed within the substrate active region 110, preferably within the source/drain regions 150. The embedded stressor 205 comprises a material with a lattice constant different from the substrate 110. In a preferred embodiment, the substrate 110 comprises silicon with lattice constant approximately 5.431 Å, and the embedded stressor 205 comprises SiGe alloy. The SiGe alloy may have a lattice constant between about 5.431 Å and about 5.657 Å depending on concentration of germanium. The atomic fraction, x, of germanium in the silicon-germanium alloy, $Si_{(1-x)}Ge_x$, of embedded stressor is preferably between about 0.01 and about 0.99, more preferably between about 0.20 and 0.99.

Because the lattice constant of the SiGe alloy is greater than silicon, the strain within the channel region 137 is a compressive strain that is aligned along a source-to-drain direction 210 between the source/drain regions 205. Because hole mobility is increased in such a strained channel configuration, the MOSFET 101 is preferably a PMOSFET when the embedded stressor 205 has a lattice constant greater than the substrate 105.

In other embodiments of the invention, the embedded stressor 205 comprises a material having a lattice constant less than the substrate 105, for example SiC. In an embodiment, a SiC stressor may have an atomic fraction of carbon between about 0.01 and about 0.04, which causes a tensile strain aligned along the source-to-drain direction 210 between the source/drain regions 205. Because electron mobility is increased in such a strained channel configuration, the MOSFET 101 is preferably a NMOSFET when the embedded stressor 205 has a lattice constant less than the substrate 105.

Continuing with FIG. 2, the embedded stressor 205 may be formed using an ion implantation process such as a modified gas cluster beam ion irradiation process 215$a$ or a plasma immersion ion implantation (PIII) 215$b$, thereby producing the structure shown in FIG. 2. The gate electrode material 145, gate electrode 130, liner 132 and sidewall spacers 140 serve as an implant mask. Other regions of the MOSFET 101 may be protected with a conventional hard mask (not shown) such as silicon nitride.

In an embodiment, a GCIB implantation process 215$a$ is formed by injecting one or more gases into the gas-cluster ion-generating source and allowing them to mix. Germanium-containing gases such as germane ($GeH_4$) or germanium tetrafluoride ($GeF_4$), for example, may be employed for incorporating germanium into gas-clusters. Silicon-containing gases such as silane ($SiH_4$) and silicon tetrafluoride ($SiF_4$), for example, may be employed for incorporating silicon into gas-clusters.

Applicants have found that a conventional GCIB process, without further processing, may generate defects in the substrate 105, particularly in the embedded stressor 205. One particularly detrimental defect is end of range (EOR) implant defects. These defects are typically confined to an EOR region 220 at the bottom of the embedded stressor, as illustrated in FIG. 2.

In preferred embodiments of the invention, a GCIB 215$a$ comprising Ge is accelerated at less than about 50 keV at a dose of less than about 5E16 ion/cm$^2$. In one example, a 30 keV Ge dose achieved a maximum implant depth, d, about 16.2 nm. The EOR region 220 was also formed a distance, d, below the surface of the substrate 105, as shown in FIG. 2. In FIG. 2, the maximum implant depth is illustrated as being less than the depth of the source/drain regions 150; however, structures wherein the maximum implant depth is greater than or equal to the depth of the source/drain regions are within the scope of embodiments of the invention as well. Embodiments may also include elevated source/drains.

In other embodiments, the embedded stressor 205 may be formed with a PIII implant 215$b$, although such an implant also forms EOR implant defects. The depth of the ion implantation may be controlled through the impurity implant energy, which may range between about 1 KeV and about 800 KeV. The impurity concentration may range between about $5*10^{17}$ atoms/cm$^3$ and about $5*10^{20}$ atoms/cm$^3$. The processing tool to perform PIII may include a single and/or batch wafer reactor, wherein a direct current (DC) and/or radio frequency (RF) bias may be applied to the active region substrate areas 110.

The PIII reactor employs a process ambient pressure that may range between 0.01 mTorr and about 1000 Torr. The substrate 110 may be held at a temperature ranging between 150° C. and about 800° C. High density plasma may be produced by a microwave electron cyclotron resonance (ECR) plasma, a helicon plasma, a inductively coupled plasma and/or other high density plasma sources. The plasma may comprise Ar, H, N, Xe, $O_2$, As, $B_2H_6$, $GeH_4$, P, and/or other sources of the impurity. For example, the helicon plasma may utilize RF powers ranging between about 200 Watts and about 1000 Watts. The applied bias may range between about ±200 V and about ±1500V. The stressor 205 may be located at a depth ranging between about 10 nm and about 100 nm from the surface of the active region substrate area 110.

Figure 3:
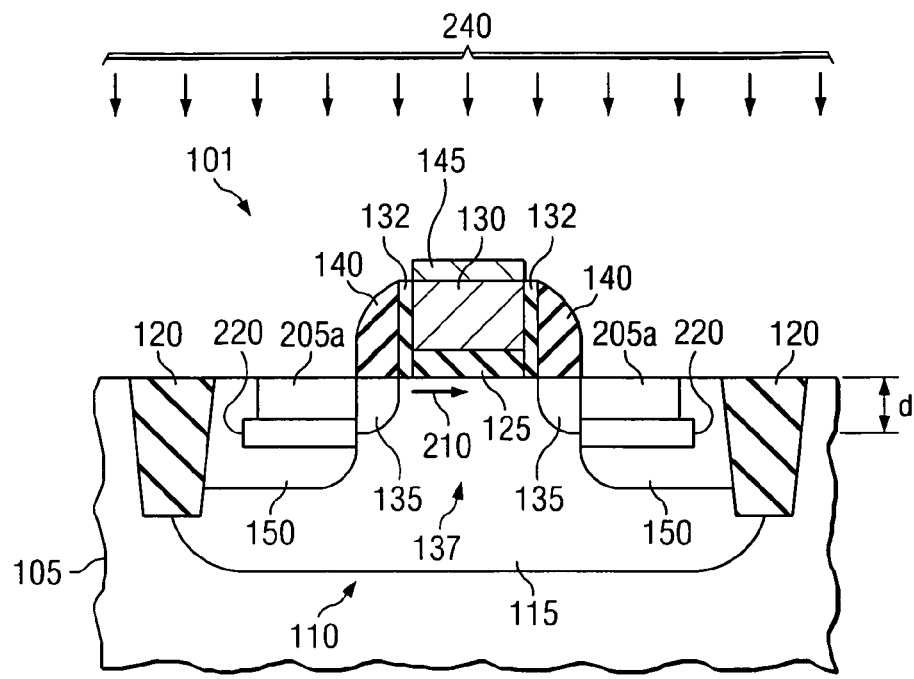
FIGS. 3 and 4 are cross-sectional views of a carbon implant and anneal for repairing EOR defects according to embodiments of the invention.

Applicants found that incorporating carbon into the embedded stressor 205 enhances the EOR defect removal using a low temperature anneal, i.e., an anneal below about 900° C. Therefore, as illustrated in FIG. 3, a carbon implant 240 is used to form a carbon-containing, embedded stressor 205$a$. In preferred embodiments, the carbon concentration is between about 0.1 at. % and about 0.001 at. % in the carbon-containing zone 205$a$. In one embodiment of the invention, the carbon is implanted at below 15 KeV at a dose between about $10^{13}$ ion/cm$^2$ and about $10^{15}$ ion/cm$^2$. Preferably, the carbon concentration is sufficiently below the level that would offset the compressive properties of a SiGe stressor.

Without intending to be limited by any theory, carbon may prevent implant related dislocation damage. The presence of the carbon causes the rapid extinction of the silicon self-interstitials upon recrystallization annealing, thereby preventing the formation of EOR defects, as well as, transient enhanced diffusion of the implanted dopant species. EOR defects in particular may form from compressive forces caused by the larger Ge substituting at a Si lattice site. Carbon, being smaller than silicon, may relieve Ge-generated stress.

Figure 4:
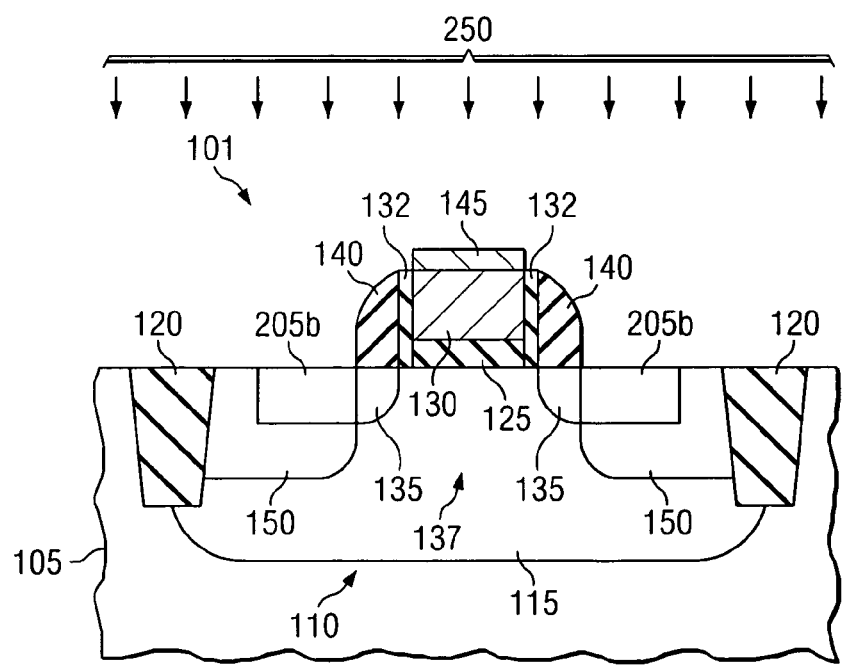

The preferred concentration of carbon within the embedded stressor 205$a$ advantageously enhances EOR removal in an annealing process. Turning now to FIG. 4, an annealing process 250 substantially forms an EOR free lattice mismatched region 205b. Applicants found that a conventional low temperature anneal was ineffective at removing EOR defects. Without a preferred level of carbon in the embedded stressor, EOR defects remained after a 700° C., 1 hr anneal, and residual EOR defects remained after a conventional 800° C., 1 hr anneal. Without a preferred level of carbon in the embedded stressor, Applicants found that the EOR defects are substantially removed by a high temperature, i.e. 900° C., 1 hr anneal; however, these annealing conditions caused diffusion of source/drain and stressor dopants. The diffusion in turn degraded junction and stressor performance.

FIG. 4 illustrates the MOSFET 101 of FIG. 3 after further processing according to preferred embodiments of the invention. EOR defects are substantially removed or repaired with a post-implant anneal 250. Preferably, the post-implant anneal 250 is less than about 5 hr in a furnace annealing and more preferably less than about 10 min in an RTA annealing. In an embodiment, annealing is performed until the EOR defect density is reduced below about $10^5$ cm$^{-3}$ in the source/drain region. The post-implant anneal 250 may be performed by a furnace tool or by a rapid thermal anneal (RTA) tool. The post-implant anneal 250 is preferably conducted in an inert ambient such as argon or nitrogen.

Still other embodiments of the invention, provide a method of suppressing defect formation in strained-channel transistors. Preferred embodiments implanting a first element, X, into the source/drain regions 205, wherein the first element occupies a silicon crystalline lattice site. Preferably, the Si—X chemical bond has a greater interatomic spacing than a Si—Si chemical bond. Embodiments may further include implanting a second element, Y, into the source/drain regions 205. Preferably, the second element occupies a silicon crystalline lattice site, and wherein an Si—Y chemical bond has a smaller interatomic spacing than a Si—Si chemical bond. Preferred embodiments of the invention may further include annealing the substrate 105 after implanting the second element, so that source/drain regions 205 apply a compressive stress to the channel region 137 of the strained-channel transistor.

Preferably, the first element comprises germanium and the second element comprises carbon. Implanting the first element may form a silicon germanium alloy, and implanting the second element may form silicon carbon alloy. The silicon germanium alloy corresponds to the general formula $Si_{(1-x1)}Ge_{x1}$, wherein x1 is between about 0.01 and 0.99. The silicon carbon alloy corresponds to the general formula $Si_{(1-y1)}C_{y1}$, wherein y1 is between about 0.001 and about 0.00001. Annealing preferably comprises maintaining a temperature less than about 800° C. In preferred embodiments of the invention, the embedded stressor 205 is preferably greater than about 15 nm deep. The strain within the channel region 137 is preferably about 0.1% to about 4%.

Following the embodiments described above, device fabrication is completed using conventional semiconductor processing steps as are known in the art. For example, a silicide may be formed by depositing a metal such as titanium or cobalt or nickel and then treated to form self-aligned silicide, or salicide, on top of the gate electrode and the source/drain regions and other areas to provide a lower resistance and improve device performance. Following the salicide step, interlevel insulation layers are formed above the substrate using deposition steps to deposit oxide, nitride or other conventional insulation layers, typically silicon dioxide is formed. Contact areas are patterned and etched into the insulators to expose the source, drain and gate electrodes, the resulting vias are filled with conductive material to provide electrical connectivity from metallization layers above the interlevel insulating layers down to the gate electrodes, the source and the drain regions. Metallization layers of aluminum, or copper, may be formed over the interlevel insulation layers using known techniques such as a aluminum metallization process or a dual damascene copper metallization process to provide one, or several, wiring layers that may contact the vias and make electrical connections to the gate electrodes and the source and drain regions.

Embodiments of the invention advantageously provide a simpler process flow, a higher throughput, at lower cost. MOSFETs formed according to embodiments improve short channel effects, enhance device performance, and improve device reliability.

Although the present invention and its advantages have been described in detail, it should be understood that various changes, substitutions and alterations can be made herein without departing from the spirit and scope of the invention as defined by the appended claims. The invention not limited to precise numerical values that have been used to illustrate embodiments. Furthermore, an expression of approximation preceding an exemplary parameter range indicates approximation with respect to the entire range. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor fabrication method, the method comprising:
    forming a gate electrode over a substrate;
    forming source/drain regions in the substrate, the source/drain regions oppositely adjacent the gate electrode;
    irradiating at least a portion of the source/drain regions with a gas cluster ion beam to form an embedded stressor;
    implanting carbon into the source/drain regions; and
    annealing the substrate after irradiating the at least the portion of the source/drain regions and implanting the carbon such that a compressive stress is applied in the substrate under the gate electrode.

2. The method of claim 1, wherein irradiating the source/drain regions comprises forming a silicon alloy layer in the substrate greater than about 15 nm thick.

3. The method of claim 2, wherein the silicon alloy layer comprises an alloy corresponding to the general formula $Si_{(1-x)}Ge_x$, wherein x is between about 0.01 and 0.99.

4. The method of claim 2, wherein implanting the carbon comprises implanting a portion of the carbon through the silicon alloy layer.

5. The method of claim 1, wherein the annealing comprises annealing the substrate at less than about 800° C. until an end of range (EOR) defect density in the source/drain regions is less than about $10^5$ cm$^{-3}$.

6. A method of suppressing defect formation in strained-channel transistors, the method comprising:
    forming a transistor in a substrate, the transistor comprising a gate electrode over a silicon substrate, a channel region in the substrate under the gate electrode, and a first source/drain region adjacent one edge of the gate electrode and a second source/drain region adjacent an opposite edge of the gate electrode;

using a gas cluster ion beam, implanting a first element X into the first and second source/drain regions to form first and second embedded stressors, wherein the first element occupies a silicon crystalline lattice site, and wherein a Si—X chemical bond has a greater interatomic spacing than a Si—Si chemical bond;

implanting a second element Y into the first and second embedded stressors, wherein the second element occupies a silicon crystalline lattice site, and wherein an Si—Y chemical bond has a smaller interatomic spacing than a Si—Si chemical bond; and annealing the substrate after implanting the second element, so that the first and second embedded stressors apply a compressive stress to the channel region of the strained-channel transistor.

7. The method of claim 6, wherein implanting the first element X comprises implanting Ge at an energy less than about 50 keV and at a dosage less than about 5E16 ions/cm$^2$.

8. The method of claim 6, wherein the annealing is at a temperature less than about 800° C.

9. The method of claim 6, wherein the annealing is for less than about 5 hr in a furnace anneal.

10. The method of claim 6, wherein the annealing is for less than about 10 min in an RTA anneal.

11. The method of claim 6, wherein the annealing is performed using a furnace annealing or a rapid thermal annealing (RTA).

12. The method of claim 6, wherein the first element comprises germanium and the second element comprises carbon.

13. The method of claim 6, wherein implanting the first element into a silicon substrate forms a silicon germanium alloy and implanting the second element into the silicon substrate forms a silicon carbon alloy.

14. The method of claim 13, wherein the silicon germanium alloy corresponds to the general formula $Si_{(1-x1)}Ge_{x1}$, wherein x1 is between about 0.01 and 0.99, and wherein the silicon carbon alloy corresponds to the general formula $S_{(1-y1)}C_{y1}$, wherein y1 is between about 0.001 and 0.00001.

15. The method of claim 1, wherein irradiating the source/drain regions with a gas cluster ion beam forms a defect layer disposed under the embedded stressor, and wherein annealing the substrate after implanting the carbon substantially removes the defect layer.

16. The method of claim 6, wherein implanting a first element X into the first and second source/drain regions forms first and second defect layers disposed under the first and second embedded stressors, and wherein annealing the substrate after implanting the second element removes the first and second defect layers substantially.

* * * * *